United States Patent [19]

Kobayashi et al.

[11] Patent Number: 4,953,129

[45] Date of Patent: Aug. 28, 1990

[54] NONVOLATILE SEMICONDUCTOR MEMORY DEVICE CAPABLE OF RELIABLY WRITING DATA AND A DATA WRITING METHOD THEREFOR

[75] Inventors: Kazuo Kobayashi; Yasushi Terada; Takeshi Nakayama, all of Hyogo, Japan

[73] Assignee: Mitsubishi Denki Kabushiki Kaisha, Tokyo, Japan

[21] Appl. No.: 337,705

[22] Filed: Apr. 13, 1989

[30] Foreign Application Priority Data

Jul. 29, 1988 [JP] Japan .................. 63-191379

[51] Int. Cl.$^5$ ............................................. G11C 7/00
[52] U.S. Cl. .................... 365/203; 365/185; 365/189.05; 365/233
[58] Field of Search ............... 365/185, 203, 233, 205, 365/208, 189.05

[56] References Cited

U.S. PATENT DOCUMENTS 4,379,345  4/1983  Url .......................... 364/205
4,435,789  3/1984  Giebel et al. ............. 365/203

OTHER PUBLICATIONS

C. Cioaca et al., "A Million Cycle CMOS 256K EEPROM", pp. 78–79.
S. Mehrotra et al., "A 64 Kilobit CMOS EEROM with On-Chip ECC", pp. 142–143.
R. Jolly et al., "Two 35ns 64 K CMOS EEPROMs", pp. 172–173, 337–338, Feb. 1985.

Primary Examiner—Joseph A. Popek
Assistant Examiner—Michael A. Whitfield
Attorney, Agent, or Firm—Lowe, Price, LeBlanc, Becker & Shur

[57] ABSTRACT

An electrically erasable programmable read only memory (EEPROM) latches externally applied write data in column latches, erases information of selected memory cells and then writes the latched write data into the selected memory cells. This EEPROM includes detectors for detecting a potential of the latch node of the corresponding latch, chargers each for charging the corresponding bit line in response to the output of the potential detector in a latched data write cycle, and separation transistors each for separating a bit line from the latch node of the corresponding column latch in response to the activation of the chargers.

12 Claims, 8 Drawing Sheets

COLUMN LATCH

MEMORY TRANSISTOR  SELECT TRANSISTOR

NONVOLATILE SEMICONDUCTOR MEMORY DEVICE CAPABLE OF RELIABLY WRITING DATA AND A DATA WRITING METHOD THEREFOR

BACKGROUND OF THE INVENTION

1. Field of the Invention

The present invention relates to nonvolatile semiconductor memory devices and particularly to a nonvolatile semiconductor memory device capable of writing data in a page mode. More specifically, the present invention relates to a structure and a method for reliably writing data in an electrically erasable and programmable ROM (referred to hereinafter as EEPROM) capable of page mode writing.

2. Description of the Background Art

Figure 8:
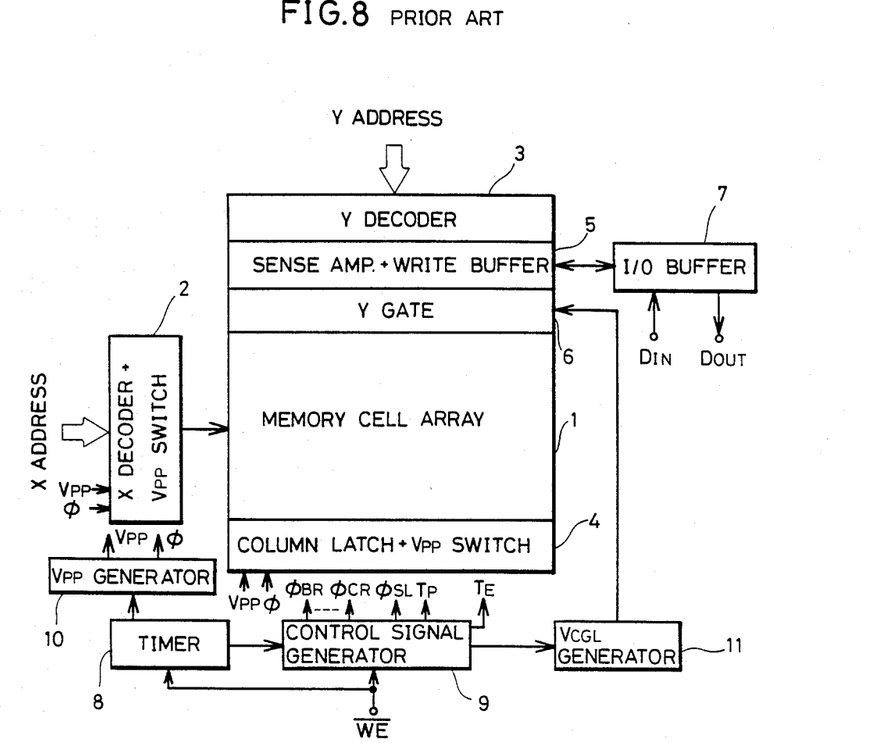
FIG. 8 is a diagram showing an example of an entire construction of a conventional nonvolatile semiconductor memory device.

FIG. 8 is a schematic diagram showing an example of an entire structure of a conventional nonvolatile semiconductor memory device.

Referring to FIG. 8, the conventional nonvolatile semiconductor memory device comprises: a memory cell array 1 in which a plurality of memory cells for storing information in a nonvolatile manner are arrayed in a matrix; an X decoder block 2 including an X decoder for selecting one row (a word line) from the memory cell array 1 in response to an X address (a row address) externally applied and a Vpp switch for applying a high voltage Vpp to the selected word line; and a Y decoder 3 for generating a signal for selecting a corresponding column (s) (a corresponding bit line) from the memory cell array 1 in response to a Y address (a column address) externally applied.

In order to write/read data, the above described device comprises: a block 4 including a column latch for temporarily latching data to be written and a Vpp switch for applying the high voltage Vpp to the corresponding bit line at the time of writing the data; a block 5 including a sense amplifier for detecting and amplifying information of a memory cell selected in reading data mode and a write buffer for transmitting external data to be written to the bit line connected to the memory cell selected in writing data mode; a Y gate block 6 connecting the selected bit line(s) to the block 5 in response to a column selection signal from the Y decoder 3; and an I/O buffer 7 for communicating data with the block 5. The I/O buffer 7 receives write data $D_{IN}$ and supplies it to the write buffer in the block 5. In the meantime, it receives the output of the sense amplifier and provides external read data $D_{OUT}$ in data reading mode.

As the nonvolatile semiconductor memory device is capable of performing operation in a byte mode, the sense amplifier and the write buffer of the block 5 are arranged for one byte (8 bits) and bit lines for one byte are connected in parallel to the sense amplifiers and the write buffers through the selected Y gates.

Peripheral circuits for controlling the operation in the memory device include: a timer 8 which is enabled in response to a write enable signal $\overline{WE}$ to define the period of write cycle; a control signal generator 9 which generates various control signals in response to the write enable signal $\overline{WE}$ and the output of the timer 8; a Vpp generator 10 which generates the high voltage program pulse Vpp and a clock signal $\phi$ in response to the output of the timer 8; and a $V_{CGL}$ generator 11 which applies a predetermined potential $V_{CGL}$ to a control gate line (to be described later) in response to a control signal from the control signal generator 9.

The timer 8 is used to determine an external write cycle and an internal write cycle, which includes an erase cycle and a program cycle.

Figure 9:
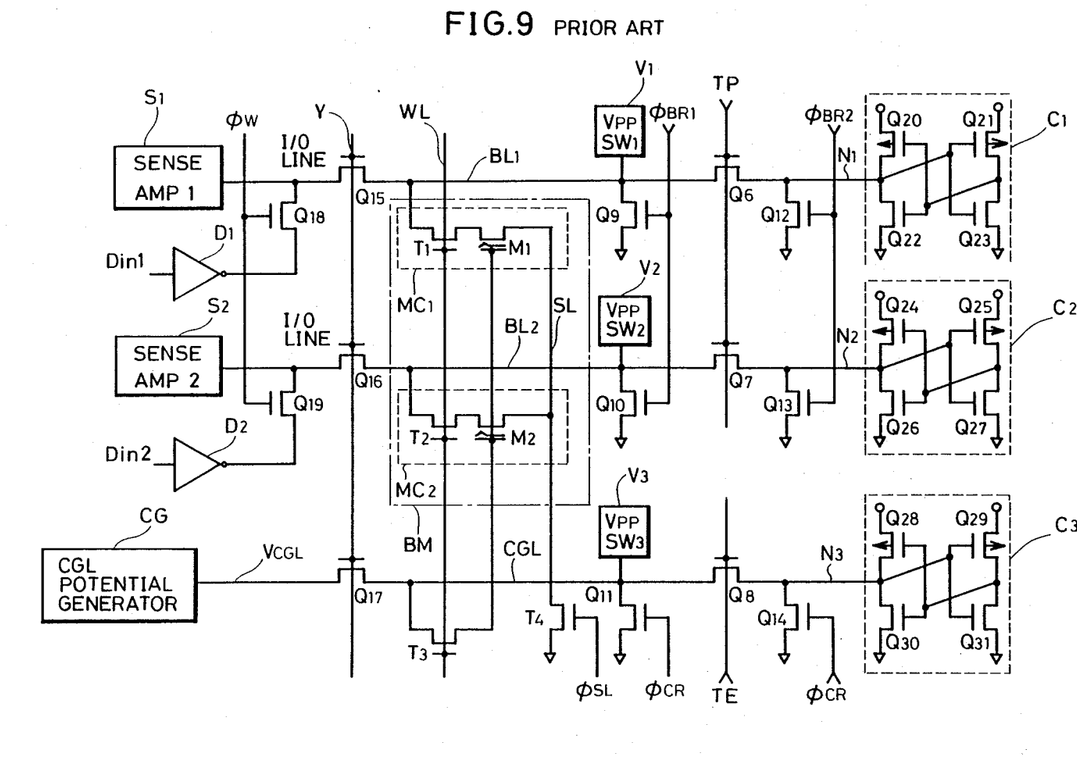
FIG. 9 is a diagram showing an example of a construction of a main part of the conventional nonvolatile semiconductor memory device.

FIG. 9 is a diagram showing a structure of a main part of the memory device shown in FIG. 8, representing memory cells for one byte and the related portions thereof. The structure shown in FIG. 9 enables input-/output of data in a byte unit and a byte selection transistor T3 is provided corresponding to the memory cells for one byte (8 bits).

The memory cells BM for one byte include memory cells MC1 and MC2. Although the memory cells BM for one byte usually comprise eight memory cells, only the two memory cells MC1 and MC2 are typically shown in FIG. 9 for the purpose of simplification.

The memory cell MC1 comprises a memory transistor M1 having a variable threshold voltage Vth, and a select transistor T1 which connects the memory transistor M1 to a bit line BL1 in response to a potential on the corresponding word line WL (the output of the X decoder block 2).

The memory cell MC2 comprises a memory transistor M2, the threshold voltage Vth of which is variable, and a select transistor T2 which connects the memory transistor M2 to a bit line BL2 in response to the potential on the corresponding word line WL.

The byte selection transistor T3 is turned on in response to the potential on the word line WL and transmits a potential on the control gate line CGL to the control gates of the memory transistors M1 and M2.

The sources of the memory transistors M1 and M2 are connected to a ground potential Vss through a transistor T4. The transistor T4 is operative in response to a control signal $\phi_{SL}$ from the control signal generator (as shown in FIG. 8).

Vpp switches V1, V2 and V3 are provided to apply the high voltage Vpp onto the bit lines BL1 and BL2 and the control gate line CGL. The Vpp switches V1 to V3 include the block 4 shown in FIG. 8.

Column latches C1, C2 and C3 are provided to temporarily latch and hold the potentials (data) on the bit lines BL1, BL2 and the control gate CGL throughout a write cycle. The column latches C1, C2 and C3 each have a JK flip-flop structure.

The column latch C1 comprises: a CMOS inverter including a p channel MOS (insulated gate) transistor Q20 and an n channel MOS transistor Q22; and a CMOS inverter including a p channel MOS transistor Q21 and an n channel MOS transistor Q23. Input and output portions of the respective inverters are cross-connected to constitute a flip-flop type latch.

The column latch C2 comprises: a CMOS inverter including a p channel MOS transistor Q24 and an n channel MOS transistor Q26; and a CMOS inverter including a p channel MOS transistor Q25 and an n channel MOS transistor Q27. Input and output portions of the respective inverters are cross-connected to constitute a flip-flop type latch.

The column latch C3 comprises: a CMOS inverter including a p channel MOS transistor Q28 and an n channel MOS transistor Q30; and a CMOS inverter including a p channel MOS transistor Q29 and an n channel MOS transistor Q31. Input and output portions of the respective inverters are cross-connected to constitute a flip-flop type latch.

One terminal of each of the p channel MOS transistors Q20, Q21, Q24, Q25, Q28 and Q29 is connected to a predetermined power supply potential Vcc. One terminal of each of the n channel MOS transistors Q22, Q23, Q26, Q27, Q30 and Q31 is connected to the ground potential Vss.

Y gate transistors Q15, Q16 and Q17 are provided which connect bit lines selected in response to the output of the Y decoder to the data input/output portions.

The Y gate transistor Q15 is turned on in response to a potential on a Y gate line Y (the output of the Y decoder) and connects the bit line BL1 to the sense amplifier S1 and the driver D1 as the write buffer through an I/O line. A transistor Q18 which is turned on in response to a control signal $\phi_W$ is provided between the I/O line and an output of the driver D1. The Y gate transistor Q16 is turned on in response to the potential on the Y gate line (the output of the Y decoder) to connect the bit line BL2 to the sense amplifier S2 and the driver D2 as the write buffer through the I/O line. A transistor Q19 which is turned on in response to the control signal $\phi_W$ is provided between the I/O line and an output of the driver D2.

A transistor Q17 which is turned on in response to the potential on the Y gate line Y to connect the control gate line CGL and a CGL potential generating circuit CG is provided between the control gate line CGL and the CGL potential generating circuit CG.

FIG. 9 shows the structure in which the sense amplifiers S1 and S2 and the drivers D1 and D2 are provided corresponding to the bit lines BL and BL2, respectively, and the number of bit lines is equal to that of sense amplifiers and drivers. However, in reality, a structure is adopted in which the bit lines BL1 and BL2 are connected to the I/O lines through the transistors Q15 and Q16. The sense amplifiers S1 and S2, and the drivers D1 and D2 are provided only for one byte and the I/O lines are also provided for one byte. Similarly, only one CGL potential generating circuit CG is provided for the control gate line CGL.

Transistors Q6 and Q7 which isolate the bit lines BL1 and BL2 from latch nodes N1 and N2 of the column latches C1 and C2, respectively, in response to a control signal TP are provided between the column latches C1, C2 and the bit lines BL1 and BL2. Similarly, a transistor Q8 which isolates the control gate line CGL from a latch node N3 of the column latch C3 in response to a control signal TE is provided between the control gate line CGL and the column latch C3.

Further, transistors Q9 and Q10 which are turned on in response to a control signal $\phi_{BR1}$ to connect the bit lines BL1 and BL2 to the ground potential Vss are provided in association with the bit lines BL1 and BL2.

A transistor Q11 which connects the control gate line CGL to the ground potential Vss in response to a control signal $\phi_{CR}$ is provided in association with the control gate line CGL.

Transistors Q12 and Q13 which are turned on in response to a control signal $\phi_{BR2}$ to connect the latch nodes N1 and N2 to the ground potential Vss are provided to the latch nodes N1 and N2, respectively.

A transistor Q14 which is turned on in response to the control signal $\phi_{CR}$ to connect the latch node N3 to the ground potential Vss is provided to the latch node N3.

The Vpp switches V1, V2 and V3 which operate responsive to high ("H") level of the potentials on the bit lines BL1 and BL2 and the control gate line CGL to generate the high voltage Vpp are provided for those signal lines, respectively.

Figure 10:
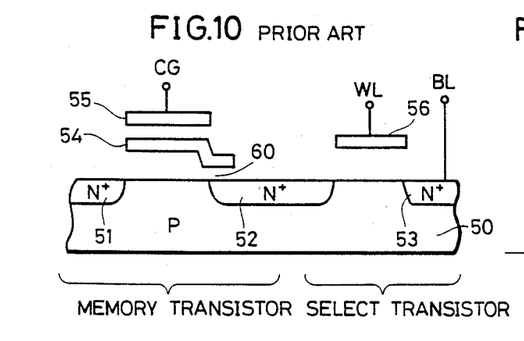
FIG. 10 is a view showing an example of a structure of a memory cell of the conventional nonvolatile semiconductor memory device.

FIG. 10 is a view schematically showing a structure of a nonvolatile memory cell, representing an example in which a memory transistor is formed by a floating gate tunnel oxide (FLOTOX) type memory transistor.

A memory transistor is formed in a predetermined region on a P type semiconductor substrate 50 for example and it comprises an N+ type impurity diffused region 51 as a source region, an N+ type impurity diffused region 52 as a drain region, a floating gate 54 for storing charge, and a control gate 55 for controlling operation of the memory transistor. An oxide film 60 of a very thin thickness (about 100 Å) is formed between the floating gate 54 and the N+ type impurity diffused region (drain region) 52, so that electrons are conducted in the form of a tunnel current through the tunnel oxide film 60.

A select transistor comprises an N+ impurity diffused region 52, an N+ type impurity diffused region 53 connected to a bit line BL, and a gate electrode 56 connected to a word line WL.

Figure 11:
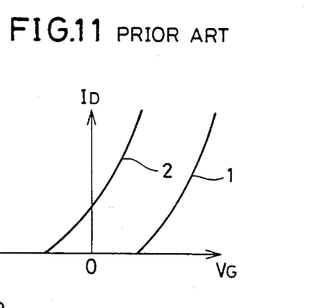
FIG. 11 is a graph showing changes in threshold voltages Vth of memory transistors in the nonvolatile semiconductor memory device.

As described above, the FLOTOX type memory transistor has a gate electrode of a two-layer structure including the control gate 55 (which functions as a normal gate electrode of a MOS transistor) and the floating gate 54 (formed in the electrically floating state between the channel region and the control gate). As a result, the threshold voltage Vth of the memory transistor differs dependent on the quantity of stored electrons in the floating gate 54. Accordingly, if electrons are injected into the floating gate 54, the threshold voltage Vth increases (as shown by ① in FIG. 11) and if electrons are emitted from the floating gate 54, the threshold voltage Vth decreases (as shown by ② in FIG. 11).

Thus, since the thin oxide film layer 60 of the thickness of about 100 Å is formed between the drain region 52 and the floating gate 54 of the memory transistor, electrons are injected to and emitted from the above described floating gate 54 when an electric field of about 10 MV/cm is applied to the tunnel oxide film 60 for a period of several ms (miliseconds) to cause tunneling of electrons. The potential between the drain region 52 and the floating gate 54 is mainly dependent on a ratio of the control gate-floating gate capacitance and the floating gate-drain capacitance at the thin oxide film 60. Therefore, in order to attain the above mentioned high electric field of 10 MV/cm, it is necessary to apply the high voltage Vpp of about 15 to 20 V to the control gate 55 or the drain region 52.

Figure 12:
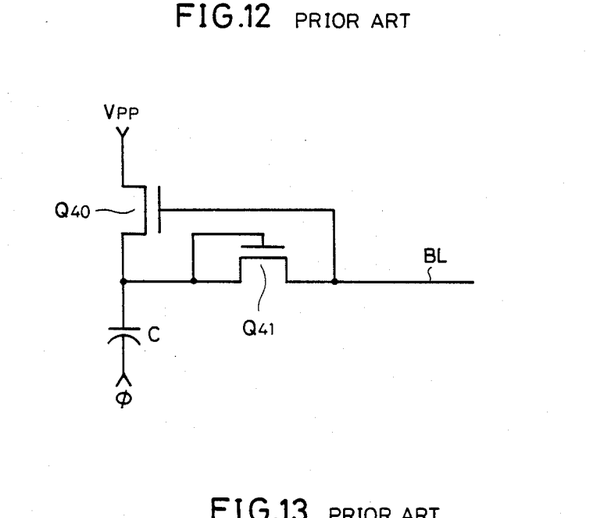
FIG. 12 is a diagram showing an example of a structure of a Vpp switch used conventionally.

FIG. 12 is a diagram showing an example of a construction of a Vpp switch shown in FIG. 9. Referring to FIG. 12, the Vpp switch comprises a transistor Q40 having its one electrode receiving the high voltage Vpp and its gate connected to a bit line BL, a bootstrap capacitance C receiving a clock signal $\phi$, and a transistor Q41 provided in diode connection between a connection point of the transistor Q40 and the capacitance C and the bit line BL. The high voltage Vpp and the clock signal $\phi$ are generated from the Vpp generator 10 shown in FIG. 8. Since the transistor Q40 is maintained in the off state in the case of low ("L") level of the potential of the bit line BL as is evident from the above described structure, the high voltage Vpp is not applied to the bit line BL and accordingly the bit line BL is maintained at "L" level. On the other hand, if the potential of the bit line BL is at "H" level, the transistor Q40 is in the on state and accordingly the high voltage Vpp is transmitted to the bit line BL through the transistors Q40 and Q41 by means of the bootstrap capacitance C which raises the voltage for each rise of the clock signal $\phi$. Consequently, if the Vpp switch is activated, the potential of the bit line at "H" level is raised to the high voltage Vpp, while if the potential of the bit line BL is at "L" level, the potential is not raised and the bit line BL is maintained at "L" level. A Vpp switch as shown in FIG. 12 is also provided for the control gate CGL.

Figure 13:
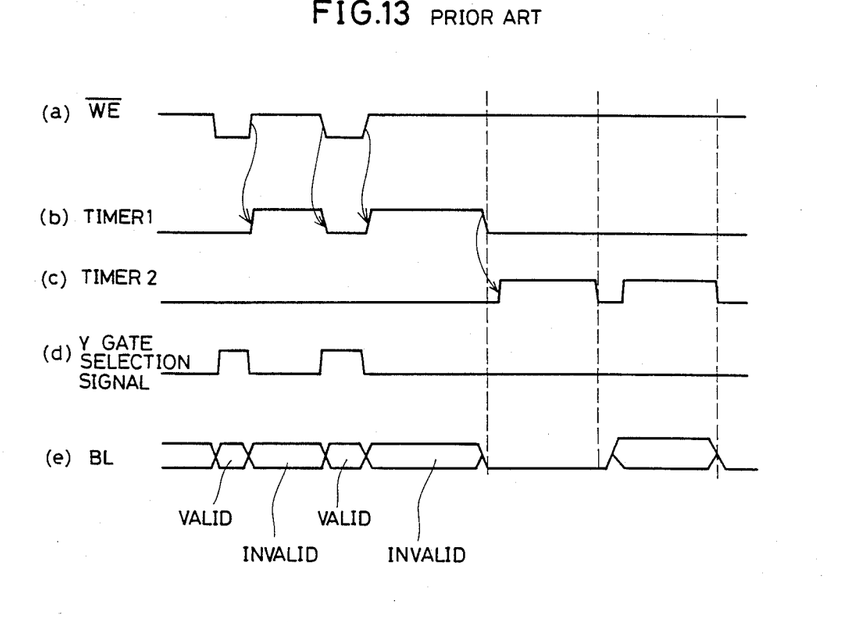
FIG. 13 is a diagram schematically showing timing in operation of the conventional nonvolatile semiconductor memory device.

FIG. 13 is a signal waveform diagram which schematically illustrates data write operation of a nonvolatile semiconductor memory device to which the present invention is applied. As shown in FIG. 13, a data write cycle in the nonvolatile semiconductor memory device includes an external write cycle for receiving externally applied data, and an internal write cycle for actually writing the received write data into the memory cells. The internal write cycle further includes an erase cycle for erasing the memory cell data, and a program cycle for actually writing the received data into the memory cells.

Writing of data is controlled by the write enable signal $\overline{WE}$. The external write cycle is so controlled that it is terminated within a predetermined period of time by control signals from an external write cycle timer 1 and an internal write cycle timer 2. More specifically, the timer 1 is started by the activation of the write enable signal $\overline{WE}$, namely, the change to "L" level. The timer 1 is reset at each change to "L" level of the write enable signal $\overline{WE}$ and re-started at each changes to "H" of $\overline{WE}$. After completion of the measuring operation of the timer 1 for the predetermined period, the external write cycle is terminated and the internal write cycle is started. Thus, if the write enable signal $\overline{WE}$ is at "H" level at the end of the measuring operation of the external write timer 1, the external write cycle is terminated and the internal write cycle timer 2 is activated to start the internal write cycle. On the other hand, if the write enable signal $\overline{WE}$ is at "L" level at the end of the timer 1, the external write cycle is prolonged until the enable signal $\overline{WE}$ reaches "H" level.

The timer 2 outputs an erase cycle timing signal and a program cycle timing signal in response to an end signal of the timer 1.

The Y gate selection signal is brought to "H" level in a period of "L" level of the write enable signal $\overline{WE}$ in writing data, whereby valid data is transmitted onto the bit line BL.

Figure 14:
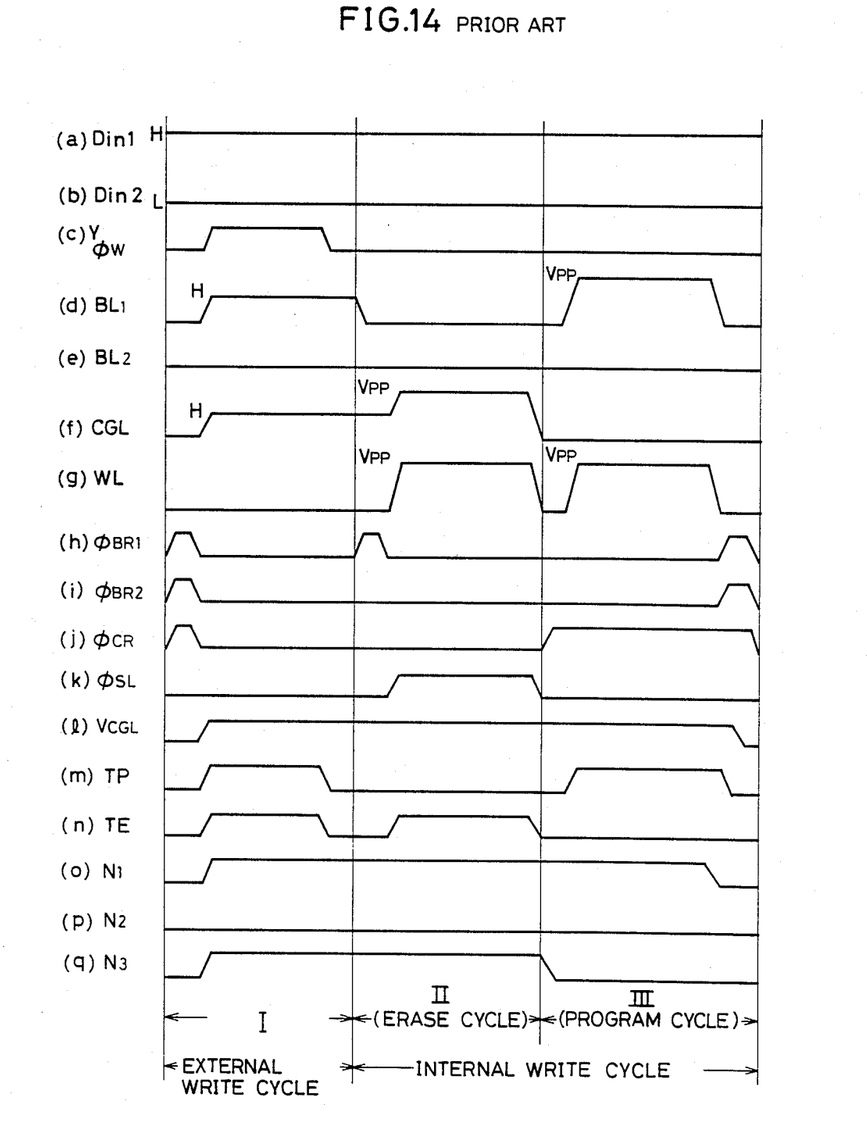
FIG. 14 is a signal waveform diagram showing operation timing for writing data in the conventional nonvolatile semiconductor device shown in FIG. 9.

FIG. 14 is a signal waveform diagram showing operation of the nonvolatile semiconductor memory device shown in FIG. 9. In the following, the operation of the conventional nonvolatile semiconductor memory device will be described in detail with reference to FIGS. 8 to 14.

Writing cycle of data in the nonvolatile semiconductor memory device (EEPROM) shown in FIG. 9 is divided into an external write cycle (for about 100 μs) for latching externally applied data (of one byte to one page) in the device and an internal write cycle (for 10 ms) applying the high voltage Vpp for changing the threshold voltage Vth of the memory transistors. The internal write cycle is further divided into an erase cycle (a "1" write cycle) for shifting in the positive direction the threshold voltage Vth of all of the selected memory transistors and a program cycle (a "0" write cycle) for shifting in the negative direction the threshold voltages Vth of the memory transistors selected for writing of "0". The time of each cycle is determined by the corresponding timer and after the external write cycle is started, each cycle proceeds automatically under the control of the timer.

First, when the write enable signal $\overline{WE}$ falls to "L" level, the write cycle is started by activation of the external write cycle timer 1. In response to the fall of the write enable signal $\overline{WE}$, the control signals (reset pulses) $\phi_{BR1}$, $\phi_{BR2}$ and $\phi_{CR}$ rise to "H" level. As a result, the bit lines BL1 and BL2, the control gate line CGL and the latch nodes N1 to N3 of the column latches reach the ground potential.

Then, the output $V_{CGL}$ of the CGL potential generating circuit CG rises from the standby potential (the reading potential) to "H" level and the control signals $\phi_W$, TP and TE also rise to "H" level. Thus, the latch nodes N1 to N3, the bit lines BL1 and BL2 and the control gate line CGL are connected through the transistors Q6 to Q8, respectively. Similarly, the drivers D1 and D2 are connected to the I/O lines through the transistors Q18 and Q19, respectively. In the same manner, in response to the change of the write enable signal $\overline{WE}$ to "L" level, the potential of the Y gate line Y selected by the Y decoder output rises to "H" level.

Now, description is made of a case in which "0" and "1" are written in the memory cells MC1 and M2, respectively, as an example. In this case, the external write data Din1 and Din2 are brought to "L" and "H" levels, respectively. Accordingly, the outputs of the drivers D1 and D2 are at "H" and "L" levels, respectively. As a result, since the transistors Q6, Q7 and Q15, Q16, Q18 and Q19 are in the on state, the external write data Din1 and Din2 are transmitted to the bit lines BL1 and BL2 through the drivers D1 and D2, respectively, and the potential $V_{CGL}$ is transmitted onto the control gate line CGL. The potentials transmitted onto the bit lines BL1 and BL2 and the control gate line CGL are latched at the latch nodes N1 to N3 of the column latches C1 to C3, respectively. In this case, "H" level is latched at the latch node N1 and "L" level is latched at the latch node N2. "H" level is latched at the node N3.

Next, when the write enable signal $\overline{WE}$ rises to "H" level, the control signals $\phi_W$, TP and TE and the Y decoder output (the potential on the Y gate line) fall to "L" level, whereby the inputting of data of one byte (the byte mode operation) is terminated. In the page mode writing, the above described operation is repeated within a period designated by the timer and inputting of data for one page at the maximum is effected. In this case, if the write enable signal $\overline{WE}$ is at "H" level at the end of the external write timer 1, the external write cycle is terminated and the internal write cycle is started.

Next, the internal write cycle is executed. In the internal write cycle, all external accesses are inhibited. The change to the internal write cycle is controlled by the timer. First, the control signal $\phi_{BR1}$ rises to "H" level and the transistors Q9 and Q10 are turned on, whereby the bit lines BL1 and BL2 are connected to the ground potential. Then, the control signals $\phi_{SL}$ and TE are both brought to "H" level and the sources of the memory transistors M1 and M2 are connected to the ground potential through the transistor T4. The control gate line CGL is maintained at "H" level. After that, high voltage Vpp pulses for erasure are generated in the Vpp generating circuit. Simultaneously with the generation of the high voltage Vpp pulses, the high voltage Vpp and the clock signal $\phi$ are applied to the Vpp switches V1 to V3. The bit lines BL1 and BL2 are at "L" level since they are connected to the ground potential, and the Vpp switches V1 and V2 do not operate. Thus, the potentials of the bit lines BL1 and BL2 are maintained at the ground potential. In the meantime, the potential of the control gate line CGL is at "H" level and accordingly it is raised to the high voltage Vpp level by the operation of the Vpp switch V3.

At this time, the potential of the simultaneously selected word line WL is also raised to the high voltage Vpp level by the function of the Vpp switch included in the X decoder block 2. As a result, the drains and sources of the memory transistors M1 and M2 are connected to the ground potential through the transistors T1, T2, the bit lines BL1, BL2 and the transistor T4, while the control gate is raised to the high voltage Vpp level since the potential on the control gate line CGL is transmitted thereto through the transistor T3. As a result, electrons are injected into the floating gates and the threshold voltages Vth of the memory transistors M1 and M2 are both shifted in the positive direction. After that, the high voltage Vpp for erasure falls to "L" level under the control of the timer and the potential of the word line WL and the control signals $\phi_{SL}$ and TE fall to "L" level, whereby the erase cycle is completed.

Then, the program cycle for writing "0" into the memory cells is started under the control of the timer. In this program cycle, first, the control signal $\phi_{CR}$ rises to "H" level and the control gate line CGL and the latch node N3 are connected to the ground potential through the transistors Q11 and Q14, respectively.

Subsequently, the control signal TP rises to "H" level and the bit lines BL1 and BL2 are connected to the latch nodes N1 and N2, respectively. Thus, the bit line BL1 is charged up to "H" level by the transference of the potential of the latch node N1 of the column latch C1 which latches "H" level. In the meantime, the bit line BL2 is maintained at the ground potential level since the column latch C2 latches "L" level at the latch node N2. Then, the high voltage Vpp and the clock signal $\phi$ are generated from the Vpp generator 10 so as to be applied to the Vpp switches V1 to V3 and the Vpp switch of the X decoder block. As a result, the bit line BL1 at "H" level is raised to the high voltage Vpp level and the potential of the selected word line WL is also raised to the high voltage Vpp level. The potential of the bit line BL2 is maintained at "L" level. Consequently, the high voltage Vpp is applied to the drain of the memory transistor M1 through the transistor T1 and the ground potential on the control gate line CGL is transmitted to the control gate of the memory transistor M1 through the transistor T3, with the result that the threshold voltage Vth of the memory transistor M1 is shifted in the negative direction (electrons are emitted from its floating gate). The memory cell M2 is kept in the erase state. Thus, writing of "0" into the memory cell MC1 is completed. Finally, the control signals $\phi_{BR1}$ and $\phi_{BR2}$ are raised to "H" level and the bit lines BL1 and BL2 are connected to the ground potential. The control signals $\phi_{CR}$ and TP fall to "L" level and the output potential $V_{CGL}$ of the CGL potential generating circuit CG is brought to a reading potential (e.g., 0 V of the ground potential level). In consequence, the write cycle is terminated.

In data read operation, a read potential (e.g., 0 V) is applied as the output potential $V_{CGL}$ from the CGL potential generating circuit CG while the control signals TP, TE, $\phi_{PR1}$, $\phi_{BR2}$, $\phi_{CR}$ and $\phi_W$ are maintained at "L" level, and the selected word line WL and Y gate line Y are set to "H" level. More specifically, when the potential of the selected word line WL is raised to "H" level, the transistors T1 to T3 are turned on to cause the memory transistors M1 and M2 to be connected to the bit lines BL1 and BL2, respectively, and to cause the read potential $V_{CGL}$ to be transmitted to the respective control gates through the transistor T3. As a result, the currents flowing through the bit lines BL1 and BL2 are defined dependent on the information stored in the memory transistors M1 and M2. The impedances of those memory transistors are transmitted to the sense amplifiers S1 and S2 through the transistors Q15 and Q16, respectively, and they are converted to potentials through the sense amplifiers S1 and S2, whereby reading is carried out.

However, in the nonvolatile semiconductor memory device, writing and reading of data are carried out normally for a byte basis or a word basis as described above and writing/reading of data for a one-bit basis cannot be performed independently for the respective memory cells in one byte. More specifically, the source line SL and the control gate line CGL are provided in common for the memory cells of one byte, and, thus, in the erase cycle, the signal $\phi_{SL}$ rises to "H" level and the source line SL is grounded through the transistor T4. Accordingly, in the erase cycle, since the potential of the selected word line WL and the potential of the control gate line CGL are both at the level of the high voltage Vpp, the select transistors T1 an T2 and the memory transistors M1 and M2 are all to be in the on state and the bit lines BL1 and BL2 are both grounded through the source line SL. Consequently, in a program cycle, when the separation transistors Q6 and Q7 are turned on, the data "0" of the column latch which latches "H" level is inverted and the data cannot be written correctly.

On the other hand, even in an erase cycle, if the source line SL is brought into the electrically floating state by changing the signal to $\phi_{SL}$ to "L" level to turn off the transistor T4, the bit lines BL1 and BL2 are not grounded through the above described path. However, in this case, the below described difficulties arise because the bit lines BL1 and BL2 are in the electrically floating state and the source line SL is provided in common for the memory cells of one byte. More specifically, if, for example, the potential of the bit line BL1 is "H" level and the potential of the bit line BL2 is "L" level equal to the ground potential level, the bit line BL1 is discharged through a path connecting the selection transistor T1, the memory transistor M1, the source line SL, the memory transistor M2, the selection transistor T2 and the bit line BL2, causing the potential of the bit line BL1 at "H" level to be lowered to "L" level. Also in this case, there is a possibility that the potential of the bit line BL2 at "L" level may be raised to "H" level due to noise caused by charging from the bit line BL1 or coupling capacitance with the Vpp switch, to cause the data latched in the column latch to be inverted in the program cycle. Consequently, in any case, the data latched in the column latch is inverted in the program cycle and the data cannot be written correctly.

In this case (in the case of $\phi_{SL}$="L" level in an erase cycle), the above described difficulties do not occur if a source line for the memory cells of one byte is provided individually for each bit line. However, such a structure requires two connection lines for one pitch of memory cells, which constitutes a considerable difficulty against enhancement of integration scale.

In order to avoid the above described difficulties, it is necessary to increase the latching ability of each column latch and to make each column latch have a capability of charging the bit line from "L" level to "H" level. For those purposes, it is necessary to increase the size of the transistors of each column latch. However, in such a case, the size of the column latch is to be increased and it becomes difficult to provide a column latch in a fine pitch of bit lines, reduced by enhancement of integration scale. Thus, it would be considerably difficult to enhance integration scale of memory devices.

In writing data (in an external data write cycle), it is necessary to invert the level of the latch node of the column latch reset at "L" level to "H" level dependent on input data (write data). Accordingly, the transistors (Q18-Q15-Q6, and Q19-Q16-Q17) which transmit input data to the latch nodes of the column latches, as well as the drivers D1 and D2 need to have abilities (current supply capabilities) for inverting the latch data in the column latches at "L" level to "H" level. This would cause increases in sizes of the respective transistors and drivers, making it difficult to enhance the integration scale of memory devices.

In addition, also with respect to the control gate line, it is necessary for the column latch to have a capability of charging the control gate line at "L" level to "H" level in the external data write cycle. Further, the CGL potential generating circuit and the transistors Q17 and Q8 are required to have capabilities of inverting the latch data in the column latch reset at "L" level to "H" level. In consequence, the sizes of the transistors Q17 and Q8 and the CGL potential generating circuit would be increased similarly, which would a series obstacle to the enhancement of integration scale in semiconductor memory devices.

SUMMARY OF THE INVENTION

The present invention has been accomplished to solve the above described difficulties in the conventional nonvolatile semiconductor memory device and, therefore, it is an object of the present invention to provide a nonvolatile semiconductor memory device which makes it possible to reduce areas occupied by column latches for latching potentials on bit lines and control gate lines and drivers for transmitting write data and to decrease sizes of Y gate transistors and separation transistors, whereby a large integration scale and a large storage capacity can be easily realized.

A nonvolatile semiconductor memory device according to the present invention includes devices one provided for each bit line, for detecting a latch potential in a column latch connected to the corresponding bit line; devices, one for each bit line, to be activated at least in a program cycle, for charging a corresponding bit line in response to an output of the latch potential detecting device; and circuitry responsive to the activation of the charging devices, for turning off a separation transistor.

Preferably, the charging device and the potential detecting device are also provided corresponding to a control gate line.

The charging device according to the present invention is activated at least in a program cycle and if the latch potential detecting device detects "H" level, the charging device charges the corresponding bit line and maintains at "H" level the potential of the bit line connected to a memory transistor where data "0" is to be written. After that, the separation transistor is turned on the column latch and the corresponding bit line are connected. Accordingly, if the source line SL is connected to the ground potential, the potential of the bit line connected to the selected memory transistor where data "0" is to be written is connected to the corresponding column latch after it has been charged to "H" level. Consequently, the charging capacity of the column latch does not need to be so large as to charge the corresponding bit line and, thus, data can be written correctly with a smaller capacity of the column latch compared with the prior art.

Similarly, even if the current supply capabilities of the drivers, Y gate transistors, and separation transistors are small, the latch data in the column latch can be inverted to "H" level in a satisfactory manner if the size of the column latch is reduced, and since the bit line connected to the selected memory transistor where data "0" is to be written is charged to "H" level by the charging device, the data "0" can be written correctly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
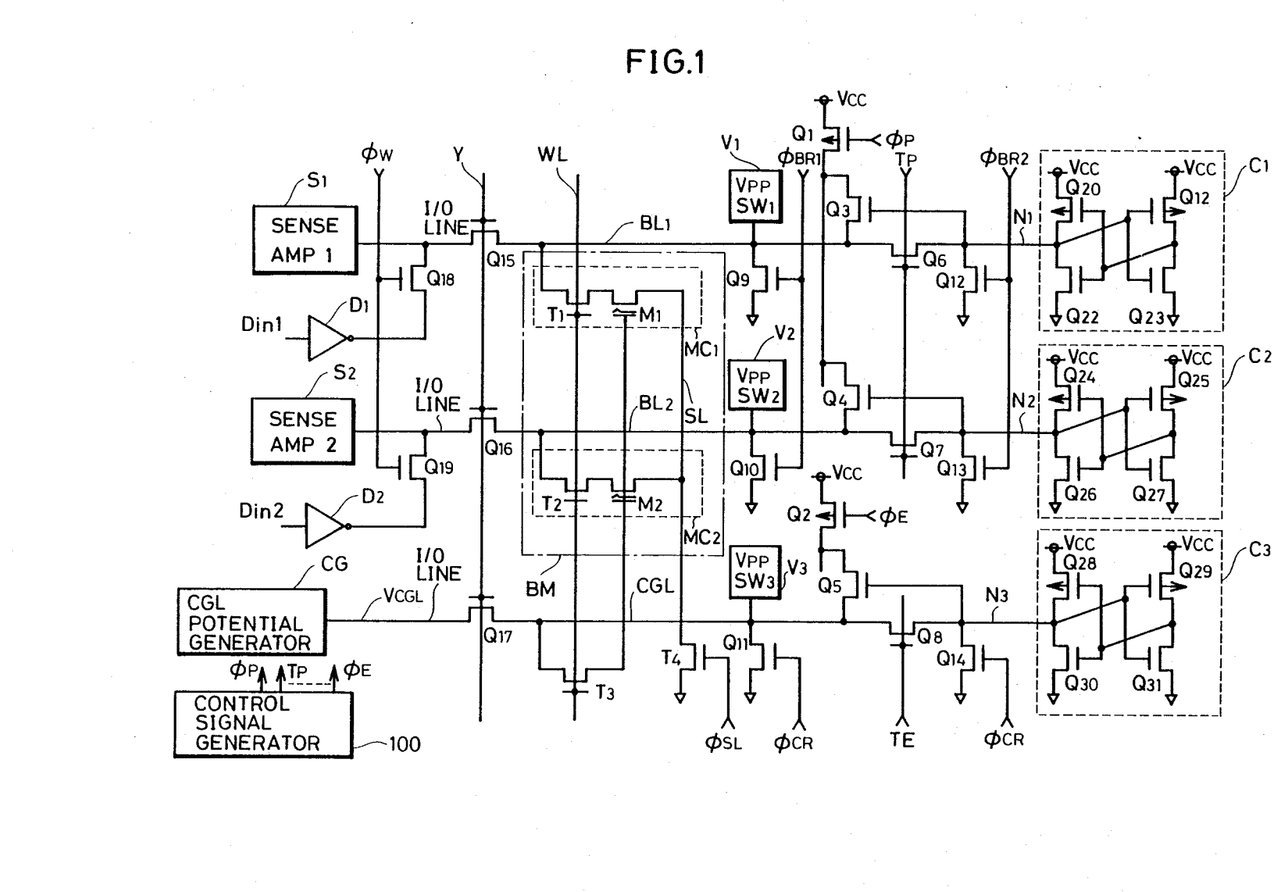
FIG. 1 is a diagram showing a construction of a main part of a nonvolatile semiconductor memory device according to an embodiment of the present invention.

FIG. 1 is a diagram showing a construction of a main part of a nonvolatile semiconductor memory device according to an embodiment of the invention, in which the same reference numerals as in FIG. 9 denote the corresponding portions.

Referring to FIG. 1, the nonvolatile semiconductor memory device according to the present invention includes latch node potential detecting device and bit line charging device for each bit line to reliably charge a bit line connected to a memory cell where "0" is to be written, to "H" level in a program cycle. More specifically, in relation to the bit line BL1, there are an n channel MOS transistor Q3 having its gate connected to the latch node N1 of the column latch C1, for detecting the potential of the latch node N1, and a p channel MOS transistor Q1 to be activated in response to a signal $\phi_P$, for charging the bit line BL1 to "H" level through the transistor Q3.

For the bit line BL2, there are an n channel MOS transistor Q4 having its gate connected to the latch node N2 of the column latch C2, for detecting the potential of the latch node N2, and a transistor Q1 for charging the bit line BL2 through the transistor Q4. The transistor Q1 is provided commonly for each bit line and it is turned on in response to the control signal $\phi_P$ to charge a corresponding bit line through the respective transistors in a program cycle.

For the control gate line CGL, there are an n channel MOS transistor Q5 for detecting the potential of the latch node N3 of the column latch C3, and a p channel MOS transistor Q2 to be turned on in response to a control signal $\phi_E$, for charging the control gate line CGL through the transistor Q5. The control signal $\phi_E$ changes to "L" level in an erase cycle and it is raised to "H" level in an external write cycle and a program cycle. Accordingly, the control gage line CGL is charged to "H" level in an erase cycle.

A control signal TP to be applied to the gates of separation transistors Q6 and Q7 changes to "H" level after elapse of a predetermined time after the change of the control signal $\phi_P$ to "L" level in a program cycle. Accordingly, after completion of the charging of the bit line, the latch nodes of the column latches and the bit lines are connected.

The control signals $\phi_P$, TP, $\phi_E$ are generated by a control signal generator 100 which operates in response to an output of a timer.

Figure 2:
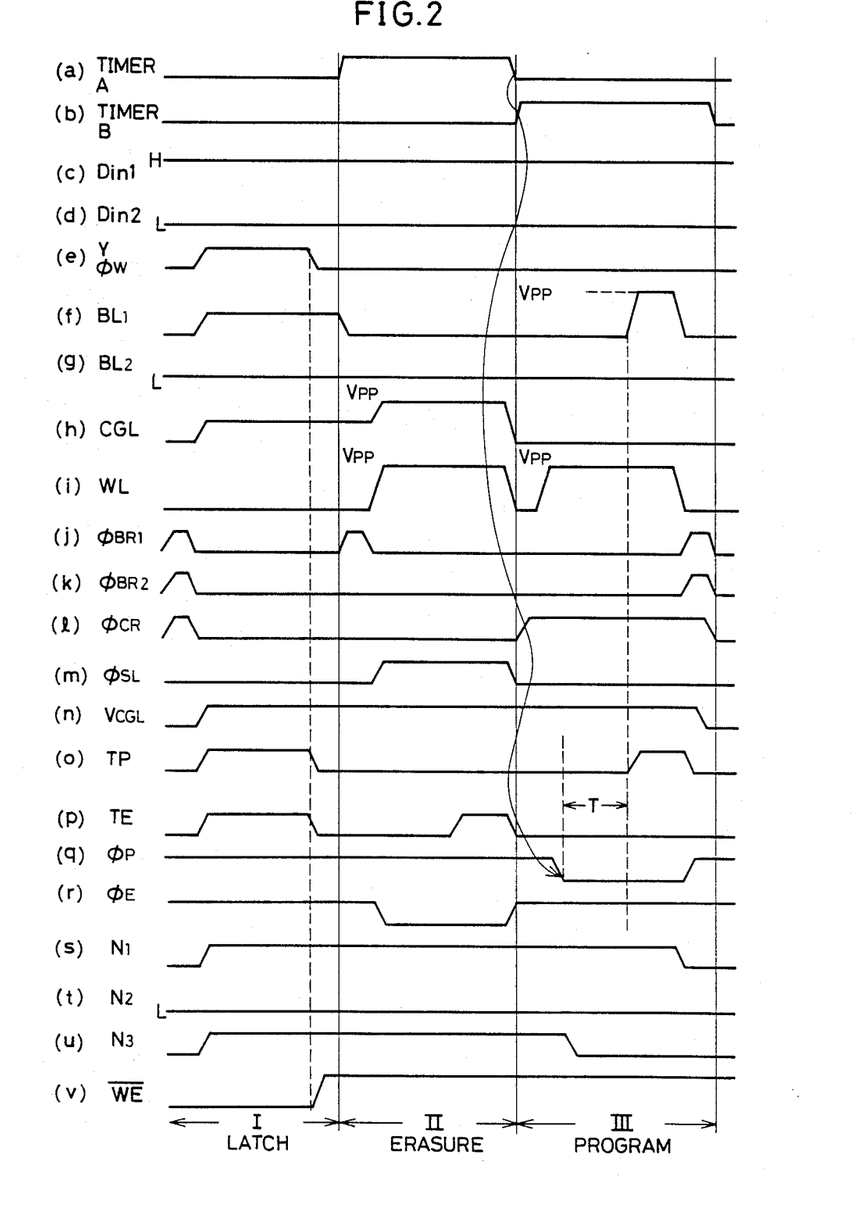
FIG. 2 is a waveform diagram showing operation of writing data in the nonvolatile semiconductor memory device of the embodiment.

Next, operation of the nonvolatile semiconductor memory device of this embodiment will be described with reference to FIG. 2 showing a waveform diagram of operation for writing data. However, the same operation as in the conventional nonvolatile semiconductor memory device described with reference to FIG. 9 is omitted from the following description for the purpose of simplification.

First, reading of data is effected at the same timing as in the conventional nonvolatile semiconductor memory device, by raising the control signals $\phi_P$ and $\phi_E$ to "H" level and turning off the transistors Q1 and Q2. Next, writing of data will be described.

At the start of an external write cycle (as shown by I in FIG. 2), reset pulses $\phi_{BR1}$, $\phi_{BR2}$ and $\phi_{CR}$ rise to "H" level and the transistors Q9, Q10, Q11, Q12, Q13 and Q14 are turned on. As a result, the bit lines BL1 and BL2, the control gate CGL and the latch nodes N1, N2 and N3 are connected to the ground potential. Then, voltage signals $V_{CGL}$, $\phi_W$, TP and TE from the CGL potential generating circuit CG rise to "H" level, whereby the bit lines BL1 and BL2 and the control gate line CGL are connected to the latch nodes N1, N2 and N3, respectively, and the drivers D1 and D2 are connected to the I/O lines. At this time, the control signals $\phi_P$ and $\phi_E$ are maintained at "H" level and the transistors Q1 and Q2 are maintained in the off state.

A column selection signal outputted from the Y decoder is transmitted onto the Y gate line with the same timing as for the control signal $\phi_W$, whereby the transistors Q15 to Q17 are turned on. Thus, outputs of the drivers Din1 and Din2 and the CGL potential generating circuit CG are transmitted to the bit lines BL1 and BL2 and the control gate line CGL.

Now, an example is considered in which "0" and "1" are to be written in the memory transistors M1 and M2, respectively. In this case, the external input data Din1 and Din2 are at "H", and "L" levels, respectively. Accordingly, the bit line BL1 is charged to "H" level through the driver D1 and the transistors Q18 and Q15. On the other hand, the bit line BL2 is maintained at "L" level equal to the ground potential since the potential "L" level is transmitted thereto through the driver D2 and the transistors Q19 and Q16. The control gate line CGL is charged to "H" level since the potential $V_{CGL}$ of "H" level is transmitted thereto through the transistor Q17.

After that, the external write cycle is terminated in response to the output of the timer and access from the outside is inhibited. Then, an erase cycle (as shown by II in FIG. 2) as one of the internal write cycle is started.

In the erase cycle, first, the control signals TP and TE are both at "L" level and the separation transistors Q6 Q7 and Q8 are in the off state. The potentials transmitted to the bit lines BL1 and BL2 and the control gate line CGL in the external write cycle are latched at the latch nodes N1 to N3 of the column latches C1 to C3, respectively.

Then, when the control signal $\phi_{BR1}$ rises to "H" level, the bit lines BL1 and BL2 are connected to the ground potential through the transistors Q9 and Q10 in the on state. After that, the control signal $\phi_{SL}$ rises to "H" level and the control signal $\phi_E$ falls to "L" level. As a result, the source line SL is connected to the ground potential through the transistor T4, while the control gate line CGL is charged to "H" level through the transistors Q2 and Q5 and maintained at "H" level. Then, a Vpp pulse is generated and supplied to the Vpp switch V3 and the potential of the control gate line CGL is raised to the high voltage Vpp level through the Vpp switch V3. At the same time, the potential of the selected word line WL is also raised to the high voltage Vpp level. As a result, the high voltage Vpp is applied to the respective control gates of the memory transistors M1 and M2, while "L" level of the bit lines BL1 and BL2 is transmitted to the drains of the memory transistors M1 and M2 through the transistors T1 and T2, respectively. Consequently, electrons are injected into the floating gates and the respective threshold voltages Vth are shifted in the positive direction. After that, the control signal TE is raised to "H" level, whereby the control gate line CGL and the latch node N3 are connected.

In the above described erase cycle, the control signal TE rises to "H" level after the control signal $\phi_E$ falls to "L" level and charging operation by the transistors Q2 and Q5 is reliably carried out, whereby the latched data in the latch node N3 of the column latch C3 is reliably transmitted to the control gate line CGL without being inverted. Accordingly, in the above described operation timing, the potentials of the control gate line CGL and the selected word line WL may be adapted to rise to the high voltage Vpp level after the rise of the control signal TE to "H" level. After that, the control signal $\phi_E$ rises to "H" level, whereby the transistor Q2 is turned off and the charging of the control gate line CGL is completed. Thus, the erase cycle is completed.

Next, operation in a program cycle will be described. The program cycle is started by a programming timer B included in the timer circuit. First, when the program cycle (a shown by the period III in FIG. 2) is started in response to a signal from the timer B, the control signal $\phi_{CR}$ rises to "H" level and the control signal $\phi_{SL}$ falls to "L" level. As a result, the latch node N3 of the column latch C3 is reset to the ground potential level and the source line SL is brought into an electrically floating state. The control gate line CGL is connected to the ground potential. Then, when the control signal $\phi_P$ changes to "L" level, the transistor Q1 is turned on and, in response to the "H" level potential of the latch node N1 of the column latch C1, the transistor Q3 is turned on, whereby the bit line BL1 is charged to "H" level. On the other hand, since the potential of the latch node N2 of the column latch C2 is "L" level, the transistor Q4 is kept turned off, and the bit line BL2 is maintained at the ground potential level. When the transistor Q1 is turned on in response to the control signal $\phi_P$ and the charging of the bit line BL1 is completed, that is, after a predetermined time T has passed after the change of the control signal $\phi_P$ to "L" level, the control signal TP rises to "H" level. As a result, the transistors Q6 and Q7 are turned on and the latch nodes N1 and N2 of the column latches C1 and C2 are connected to the bit lines BL1 and BL2, respectively. In the above described construction, since the bit line BL2 is connected to the ground potential through the transistor T4 and the source line SL in the erase cycle, the bit line BL2 is not brought into an electrically floating state and "L" level thereof is not raised even by the capacitive coupling with the Vpp switch V2 and other parasitic capacitance. Thus, "L" level thereof is maintained. Consequently, it is possible to prevent inversion of latched data of the column latch C2 connected to the bit line BL2 in the program cycle. After completion of the charging of the bit line BL1 through the transistors Q1 and Q3, the control signal TP is raised to "H" level and the bit line BL1 is connected to the latch node N1.

Thus, the potentials of the latch nodes N1 and N2 of the column latches C1 and C2 are transmitted to the bit lines BL1 and BL2, whereby the data potentials of the bit lines BL1 and BL2 are set to "H" and "L" levels, respectively. At this time, since the bit line BL1 has been charged at "H" level, the column latch C1 does not cause inversion of data and is not required to have a capability of charging the bit line, and it only transmits the latch data to the bit line BL1. In the meantime, the potential of the control gate line CGL is maintained at "L" level. In addition, when the high voltage Vpp and the clock signal $\phi$ are generated and supplied to the respective Vpp switches V1 to V3, the Vpp switch V1 connected to the bit line BL1 at "H" level is operated, so that the potential of the bit line BL1 is raised to the high voltage Vpp level. At the same time, since the potential of the selected bit line BL has been raised to the level of the high voltage Vpp by the output of the Vpp switch included in the X decoder block, the high voltage Vpp and "L" level of the ground potential level are transmitted to the drain and the control gate of the memory transistor M1, respectively, and the threshold voltage Vth of the memory transistor M1 is shifted in the negative direction. As for the memory transistor M2, its drain and control gate are both at "L" level and the erase state is maintained. As a result, data "0" is written into the memory transistor M1.

Finally, the control signal TP changes to "L" level and the transistors Q6 and Q7 are turned off. At the same time, the control signals $\phi_{BR1}$ and $\phi_{BR2}$ are raised to "H" level. Thus, the bit lines BL1 and BL2 and the latch nodes N1 and N2 are connected to the ground potential. After that, the control signal $\phi_{CR}$ is lowered to "L" level and the transistors Q11 and Q14 are turned off. Further, the control signal $\phi_P$ is raised to "H" level in response to the fall of the control signal TP and the transistors Q1 and Q2 are turned off, whereby the write cycle is completed.

In the above described construction, one transistor Q1 and one transistor Q2 for charging may be provided in common for all the bit lines and all the control gate lines and it is not necessary to provide respective transistors corresponding to each bit line and each control gate line.

Figure 3:
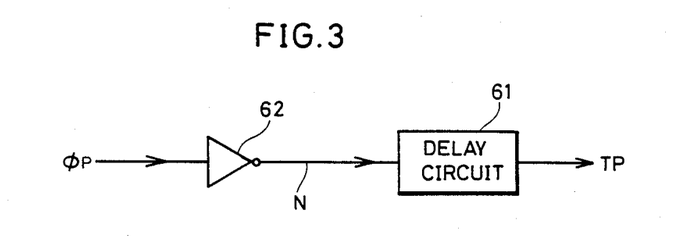
FIG. 3 is a diagram showing an example of a circuit construction for forming an operation control signal TP of a separation transistor from a control signal $\phi_P$ for charging.

FIG. 3 is a diagram showing a circuit construction for forming the control signal TP from the control signal $\phi_P$. The control signal TP is generated in the circuit construction including an inverter 62 receiving the control signal $\phi_P$, and a delay circuit delaying only a rise of an output of the inverter 62. Thus, after completion of the charging of the bit line connected to a column latch which latches the potential at "H" level, it becomes possible to connect the latch node of the column latch and the bit line.

Figure 4:
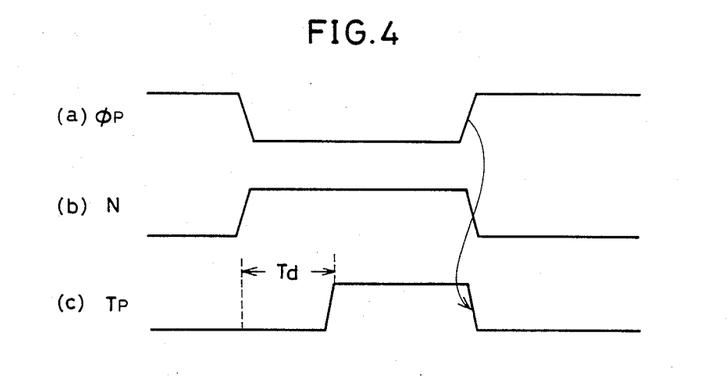
FIG. 4 is a diagram showing timing relations of the signals shown ion FIG. 3.

FIG. 4 is a waveform diagram showing operation of the circuit shown in FIG. 3. The rise delay circuit 61 outputs the control signal TP which is delayed by a predetermined period Td from the rise of the potential of the node N as the output from the inverter 62. Timing of fall of the control signal TP is synchronous with the timing of fall of the control signal $\phi_P$.

Figure 5:
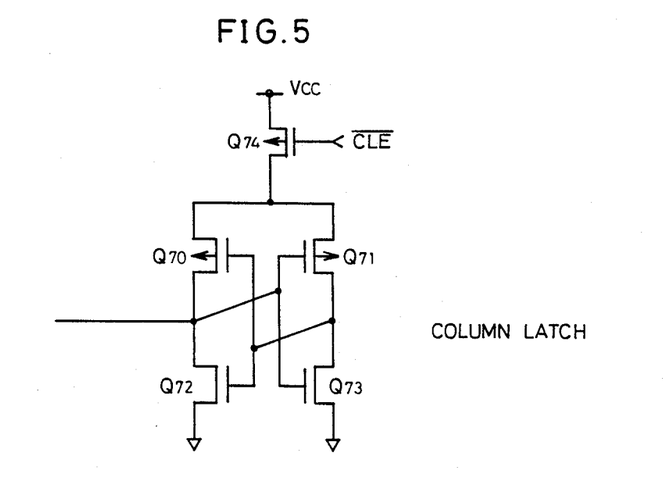
FIG. 5 is a diagram showing another construction of a column latch according to another embodiment of the invention.

In the above described embodiment, the power supply line is directly connected to each of the column latches C1 to C3. However, in this case, since the power supply line needs to be provided for each column latch, flexibility in design of a circuit arrangement might be considerably limited. In order to avoid this, a p channel MOS transistor Q74 to be turned on in response to a control signal $\overline{CLE}$ may be provided between the p channel MOS transistors Q70 and Q71 connected to the power supply line of the column latch of the transistors Q70 to Q73 and the power supply potential Vcc, as shown in FIG. 5. More specifically, the structure may be adapted in which the column latches are disconnected from the power supply in other cases than in operation. In this structure, it is not necessary to provide a power supply line for each column latch and the power supply line may be provided at a predetermined position and be connected to the column latches through the connection transistor Q74. Thus, the range of freedom in design for the power supply line is increased.

Figure 6:
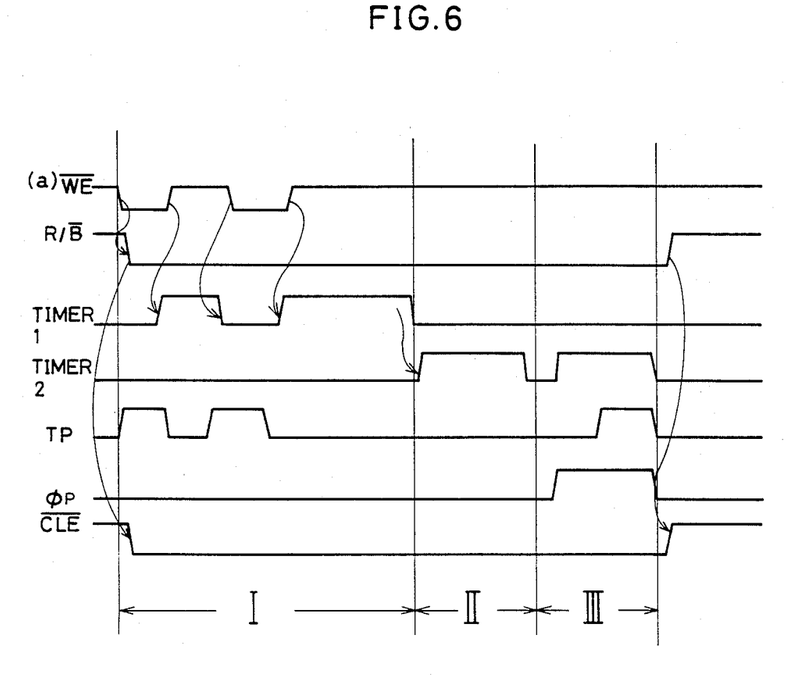
FIG. 6 is a diagram showing timing of generating the control signal $\overline{CLE}$ shown in FIG. 5.

In the structure shown in FIG. 5, the control signal $\overline{CLE}$ can be easily generated as shown in FIG. 6 by using a ready/busy signal R/B as a trigger signal, used normally in the nonvolatile semiconductor memory device. As a result, the control signal $\overline{CLE}$ can be "L" level in an activated state during the period of the write cycle (shown by I, II, III in FIG. 6), which makes it possible to reduce power consumption in the column latches.

In FIG. 6, the timers 1 and 2 provide outputs for applying timing to an external write cycle and an internal write cycle, respectively. The ready/busy signal is a signal for controlling access from the outside of the semiconductor memory device.

Figure 7:
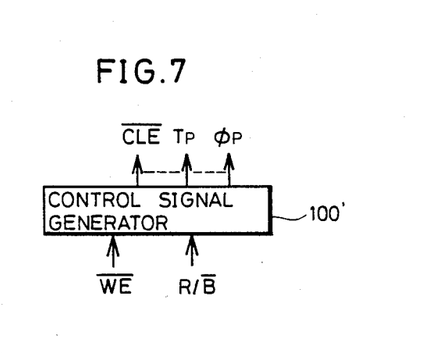
FIG. 7 shows an example of a circuit construction for generating various control signals.

Main control signals such as the control signals $\overline{CLE}$, TP and $\phi_P$ can be formed by a control signal generator 100' which receives the write enable signal $\overline{WE}$ and the ready/busy signal R/$\overline{B}$ as shown in FIG. 7.

Although in the above described embodiment the p channel MOS transistors are used as the transistors Q1 and Q2 for charging, the p channel MOS transistors may be replaced by n channel MOS transistors. In this case, it is necessary to invert the polarities of the respective control signals $\phi_P$ and $\phi_E$.

In addition, the operation timing shown in FIG. 2 is provided by way of example, and other clock timing may apply for operation. More specifically, the transistors Q12 to Q14 for example are not particularly required and any clock timing may be applied in the construction of the embodiment shown in FIG. 1 in a manner of raising the control signals $\phi_{BR1}$ and TP or the control signals $\phi_{CR}$ and TE to "H" level simultaneously in response to the rise of the control signal $\phi_{BR2}$ to "H" level.

In addition, it is not particularly necessary to ground the bit lines BL1 and BL2 in response to the control signal $\phi_{BR1}$ in an erase cycle. Further, charging operation may be carried out by lowering the control signals $\phi_P$ and $\phi_E$ to "L" level synchronously with the activation of the control signals TP and TE in an external write cycle.

Although the memory cells formed by FLOTOX memory transistors were described by way of example as the memory cells included in the nonvolatile semiconductor memory device of the above described embodiment, other memory cells including memory transistors capable of changing threshold voltages with other construction, such as MNOS memory transistors may be used.

In addition, the column latches are not limited to the CMOS J-K flip-flop latches shown in FIG. 1 and they may have other circuit construction, such as NMOS J-K flip-flops, enabling temporary storing of data of "L"/"H" levels.

If the column latches are formed by a CMOS structure for example, current in operation can be reduced compared with other structures.

In the control gate line CGL, it is not particularly necessary to provide the transistor Q2 for charging and the transistor Q5 for potential detection.

As described above, according to the present invention, the nonvolatile semiconductor memory device includes a least the devices for detecting the potential of the latch node of a column latch provided corresponding to each bit line, and the devices activated in a program cycle, for charging the corresponding bit line to a predetermined potential in response to the output of the latch node potential detecting devices. Consequently, the column latch related with the corresponding bit line does not need to charge the bit line in the program cycle and it becomes possible to reduce the size of transistors constituting each column latch and to reduce the area occupied by the column latch.

In addition, since the size of the transistors of each column latch can be made smaller, the latch data in the corresponding column latch can be easily inverted (from "L" level to "H" level) in an external write cycle and the sizes of the drivers for writing, the Y gate transistors and the separation transistors can be decreased. Thus, the areas occupied by the respective circuits and the transistors can be reduced and the integration scale can be easily enhanced.

In addition, since the size of the transistors of each column latch can be made smaller and the data of the corresponding column latch can be easily inverted, the time required for the data in the column latch to be definitely set in writing of data, namely, the data setup time can be shortened and the time required for writing data can be considerably reduced.

Further, since the source line SL is grounded in an erase cycle, the potential of the bit line at "L" level can be prevented from rising and the potential of the bit line to which the "H" level potential is transmitted is reliably charged to "H" level by the charging means in a program cycle, which makes it possible to prevent erroneous writing of data due to inversion of the latch data.

Thus, the present invention makes it possible to provide a nonvolatile semiconductor memory device with a large storage capacity capable of writing data reliably and rapidly.

The foregoing and other objects, features, aspects and advantages of the present invention will become more apparent from the following detailed description of the present invention when taken in conjunction with the accompanying drawings.

What is claimed is:

1. A nonvolatile semiconductor memory device comprising: a plurality of memory cells arrayed in a matrix of rows and columns, for storing information in a nonvolatile manner, a plurality of column signals lines each connected with one column of the plurality of memory cells, a plurality of first latch means provided corresponding to the respective column signal lines, for temporarily storing a potential of the corresponding column signal line, and a plurality of first separating means for separating the column signal lines from the latch means, each of said first latch means having a latch node coupled to the corresponding column signal line through the corresponding separating means, said nonvolatile semiconductor memory device having at least a first operation cycle for writing externally applied data into a memory cell selected by an external address after having latched said data, said nonvolatile semiconductor memory device further comprising:
   means for transmitting said externally applied data to said column signal lines,
   first means provided corresponding to the respective said latch nodes, for detecting a potential of the corresponding latch node,
   first charging means provided corresponding to the respective column signal lines and to be activated in said first operation cycle, for charging the corresponding column signal line to a predetermined potential in response to an output of said first potential detecting means, and
   means for activating said separating means prior to the activation of said first charging means thereby separating said corresponding column signal line from the corresponding latch node, and for inactivating said separating means subsequent to said activation of said first charging means thereby connecting the corresponding column signal line and the corresponding latch node.

2. The nonvolatile semiconductor memory device of claim 1, further comprising:
a control signal transmitting line for transmitting a signal for controlling erasure and writing of information in each of said memory cells,
second latch means for latching a potential on said control signal transmitting line, said second latch means having a latch node coupled to said control signal transmitting line,
second separating means for separating said latch node of said second latch means from said control signal transmitting line,
second potential detecting means for detecting a potential of said latch node of said second latch means,
second charging means to be activated in an information erasure operation cycle of said memory cells, for charging said control signal transmitting line in response to an output of said second potential detecting means, and
means for activating said second separating means prior to the activation of said second charging means, thereby separating said control signal transmitting line from the latch node of said second latch means and for inactivating said separating means subsequent to said activation of said second charging means thereby connecting said control signal transmitting line and the latch node of said second latch means.

3. The nonvolatile semiconductor memory device of claim 2, further comprising:
means for inactivating and activating said second charging means and said second separating means, respectively, in said first operation cycle, thereby separating the latch node of said second latch means from said control signal transmitting line.

4. The nonvolatile semiconductor memory device of claim 1, wherein
said first potential detecting means comprises a switching transistor having its control electrode connected to the latch node of the corresponding first latch means, its one conduction terminal connected to the corresponding column signal line and its other conduction terminal receiving an output of said first charging means.

5. The nonvolatile semiconductor memory device of claim 1, further comprising:
means for inactivating and activating said first charging means and said first separating means, respectively, in an operation cycle for erasing the information of said memory cells prior to said first operation cycle.

6. A method of writing data into a nonvolatile semiconductor memory device comprising: a plurality of memory cells arrayed in a matrix of rows and columns, for storing information in a nonvolatile manner, a plurality of column signal lines each connected with one column of the plurality of memory cells, a plurality of first latch means provided corresponding to the respective column signal lines, for temporarily storing a potential of the corresponding column signal line, and a plurality of first separating means provided corresponding to the respective column signal lines, for separating the column signal lines from the latch means, each of said first latch means having a latch node coupled to the corresponding column signal line through the corresponding separating means, and said nonvolatile semiconductor memory device having at least a first operation cycle for writing externally applied data into a memory cell selected by an external address, said method comprising the steps of:
detecting a potential of each of said latch nodes,
charging the corresponding column signal line to a predetermined potential in response to the result of the potential detection of said potential detecting step in said first operation cycle, and
separating the latch node of each said first latch means from the corresponding column signal line in response to the charging operation of said charging step.

7. The data writing method of claim 6, wherein
said nonvolatile semiconductor memory device further comprises:
a control signal transmitting line for transmitting a signal for controlling erasure and writing of information in each of said memory cells,
second latch means for latching a potential on said control signal transmitting line, said second latch means having a latch node coupled to said control signal transmitting line, and
second separating means for separating said latch node of said second latch means from said control signal transmitting line, and wherein
said method further comprises the steps of:
detecting a potential of the latch node of said second latch means,
charging said control signal transmitting line in response to the result of the detection of the potential of the latch node of said second latch means in an operation cycle for erasing information of said memory cells prior to said first operation cycle, and
connecting said control signal transmitting line and the latch node of said second latch means in response to the charging of said control signal transmitting line.

8. The data writing method of claim 7, further comprising the step of:
terminating the charging of said control signal transmitting line and separating said control signal transmitting line from the latch node of said second latch means in said first operation cycle.

9. The data writing method of claim 6, further comprising the step of:
disabling the charging of said column signal lines and separating said column signal lines from the latch node of each said first latch means in a cycle for erasing information of said memory cells prior to said first operational cycle.

10. A method of writing data into a nonvolatile semiconductor memory device comprising: a plurality of memory cells arrayed in a matrix of rows and columns, for storing information in a nonvolatile manner, a plurality of column signal lines each connected with one column of the plurality of memory cells, a plurality of first latch means provided corresponding to the respective column signal lines, for temporarily storing a potential of the corresponding column signal line, and a plurality of first separating means provided corresponding to the respective column signal lines, for separating the column signal lines from the latch means, each of said first latch means having a latch node coupled to the corresponding column signal line through the corresponding separating means, and said nonvolatile semiconductor memory device having at least a first operation cycle for writing externally applied data into a memory cell selected by an external address, said method comprising the steps of:

detecting a potential of each of said latch nodes, charging the corresponding column signal line to a predetermined potential in response to the result of the potential detection of said potential detecting step in said first operation cycle, and     separating the latch node of each said first latch means from the corresponding column signal line prior to the charging operation of said charging step and connecting the latch node of each said first latch means to the corresponding column signal line subsequent to the charging operation.

11. The data writing method of claim 10, wherein said nonvolatile semiconductor memory device further comprises:

a control signal transmitting line for transmitting a signal for controlling erasure and writing of information in each of said memory cells,     second latch means for latching a potential on said control signal transmitting line, said second latch means having a latch node coupled to said control signal transmitting line, and     second separating means for separating said latch node of said second latch means from said control signal transmitting line, and wherein said method further comprises the steps of:

detecting a potential of the latch node of said second latch means,     charging said control signal transmitting line in response to the result of the detection of the potential of the latch node of said second latch means in an operation cycle for erasing information of said memory cells prior to said first operation cycle,     separating said control signal transmitting line from the latch node of said second latch means prior to the charging operation of said control signal line, and     terminating the charging of said control signal transmitting line and separating said control signal transmitting line from the latch node of said second latch means in said first operation cycle.

12. The data writing method of claim 10, further comprising the step of:

disabling the charging of said column signal lines and separating said column signal lines from the latch node of each said first latch means in a cycle for erasing information of said memory cells prior to said first operational cycle.

* * * * *